United States Patent
Suh et al.

(10) Patent No.: US 11,175,836 B2
(45) Date of Patent: Nov. 16, 2021

(54) ENHANCED DATA CLOCK OPERATIONS IN MEMORY

(71) Applicant: Qualcomm Incorporated, San Diego, CA (US)

(72) Inventors: Jungwon Suh, San Diego, CA (US); Dexter Tamio Chun, San Diego, CA (US); Michael Hawjing Lo, San Diego, CA (US); Shyamkumar Thoziyoor, San Diego, CA (US); Ravindra Kumar, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/803,977

(22) Filed: Feb. 27, 2020

(65) Prior Publication Data

US 2020/0278802 A1    Sep. 3, 2020

Related U.S. Application Data

(60) Provisional application No. 62/812,689, filed on Mar. 1, 2019.

(51) Int. Cl.
*G06F 3/06* (2006.01)
*G06F 12/0875* (2016.01)

(52) U.S. Cl.
CPC .......... *G06F 3/0625* (2013.01); *G06F 3/0634* (2013.01); *G06F 3/0656* (2013.01);
(Continued)

(58) Field of Classification Search
CPC .. G06F 3/0625; G06F 12/0875; G06F 3/0656; G06F 3/0659; G06F 3/0673;
(Continued)

(56) References Cited

U.S. PATENT DOCUMENTS

| 6,898,683 B2 | 5/2005 | Nakamura |
| 9,304,579 B2 | 4/2016 | Ware et al. |

(Continued)

FOREIGN PATENT DOCUMENTS

| WO | WO-2017011351 | 1/2017 |
| WO | WO-2018081746 A1 | 5/2018 |

OTHER PUBLICATIONS

International Search Report and Written Opinion—PCT/US2020/020374—ISA/EPO—dated May 26, 2020.
(Continued)

*Primary Examiner* — Michelle T Bechtold
(74) *Attorney, Agent, or Firm* — Qualcomm Incorporated

(57) ABSTRACT

Methods and apparatuses for improve data clock to reduce power consumption are presented. The apparatus includes a memory configured to receive a data clock from a host via a link and to synchronize the data clock with the host. The memory includes a clock tree buffer configured to toggle based on the data clock to capture write data or to output read data and a command decoder configured to detect a data clock suspend command while the data clock is synchronized between the host and the memory. The clock tree buffer is configured to disable toggling based on the data clock in response to the command decoder detecting the data clock suspend command. the host includes a memory controller configured to provide a data clock suspend command to the memory via the link while the data clock is synchronized between the host and the memory.

42 Claims, 8 Drawing Sheets

(52) U.S. Cl.
CPC .......... *G06F 3/0659* (2013.01); *G06F 3/0673* (2013.01); *G06F 12/0875* (2013.01); *G06F 2212/1028* (2013.01); *G06F 2212/45* (2013.01)

(58) Field of Classification Search
CPC ... G06F 3/0634; G06F 1/3237; G11C 29/023; G11C 7/225
See application file for complete search history.

(56) References Cited

U.S. PATENT DOCUMENTS

| | | | |
|---|---|---|---|
| 9,704,560 B2 | 7/2017 | Shaeffer et al. | |
| 2003/0189868 A1 | 10/2003 | Riesenman et al. | |
| 2009/0144587 A1* | 6/2009 | Barrenscheen | G05B 19/0426 |
| | | | 714/40 |
| 2009/0268629 A1* | 10/2009 | Hisamatsu | G06F 1/3237 |
| | | | 370/252 |
| 2013/0054866 A1* | 2/2013 | Saito | G06F 1/06 |
| | | | 710/313 |
| 2017/0004869 A1 | 1/2017 | Shin et al. | |
| 2018/0090186 A1* | 3/2018 | Kang | H04L 25/0288 |
| 2020/0133505 A1* | 4/2020 | Kim | G06F 3/0611 |

OTHER PUBLICATIONS

MICRON: "Mobile Low-Power DDR SDRAM", Jan. 1, 2014 (Jan. 1, 2014), XP055695075, 96 pages, Retrieved from the Internet: URL: https://www.micron.com/-/media/client/global/documents/products/data-sheet/dram/mobile-dram/low-power-dram/lpddr/60-series/t67m_512mb_mobile_lpddr_sdram.pdf. [Retrieved on May 13, 2020] pp. 1, 35; figure 2; table 5.

* cited by examiner

210

| Command | Bank | Pin | Address | | | | | | | CLK edge |
|---|---|---|---|---|---|---|---|---|---|---|
| | | CS | CA0 | CA1 | CA2 | CA3 | CA4 | CA5 | CA6 | |
| CAS | Any | H | L | L | H | H | WS_WR | WS_RD | WS_FS | Rise |
| | | X | DC0 | DC1 | DC2 | DC3 | WRX | WXS | B3 | Fall |

220

| Operating Mode | CAS Command Operands | | | | | | |
|---|---|---|---|---|---|---|---|
| | WS_WR | WS_RD | WS_FS | DC0-3 | WRX | WXS | B3 |
| WCK2CK SYNC for WRITE | H | L | L | LLLL | L | L | L |
| WCK2CK SYNC for READ | L | H | L | LLLL | L | L | L |
| FAST WCK2CK SYNC | L | L | H | LLLL | L | L | L |
| WCK2CK SYNC OFF | H | H | H | LLLL | L | L | L |
| WCK SUSPEND | H | L | H | LLLL | L | L | L |

FIG. 2

ENHANCED DATA CLOCK OPERATIONS IN MEMORY

CLAIMS OF PRIORITY UNDER 35 U.S.C. § 119

The present application of patent claims priority to Provisional Application No. 62/812,689 entitled "ENHANCED DATA CLOCK OPERATIONS IN MEMORY" filed Mar. 1, 2019, and assigned to the assignee hereof and hereby expressly incorporated by reference herein.

FIELD

The present disclosure relates generally to methods and apparatuses having enhanced data clock operations and more particularly, to methods and apparatuses having a data clock suspend mode to reduce power consumption while a data clock is in an always-on mode.

BACKGROUND

A computing device (e.g., a laptop, a mobile phone, etc.) may include one or several processors to perform various functions, such as telephony, wireless data access, and camera/video function, etc. A memory is an important component of the computing device. The one processor may be couple to the memory to perform the aforementioned computing functions. For example, the one processor may fetch instructions from the memory to perform the computing function and/or to store within the memory temporary data for processing these computing functions, etc.

The memory may be embedded with the one processor on a semiconductor die or be part of a different semiconductor die. The memory may perform various functions. For example, the memory may be used as cache, register file, or storage. The memory may be of various kinds. For example, the memory may be static random access memory (SRAM), dynamic random access memory (DRAM), magnetic random access memory (MRAM), NAND flash, or NOR flash, etc.

As demands grow for the computing device to perform more functions with increasing speed, power issue grows as well. While power savings may be of particular interest in mobile computing devices, non-mobile devices may also benefit from reduced power consumption to reduce waste heat generation. Thus, computing devices of various sorts may benefit from memory systems that have decreased power consumption. Schemes to reduce power consumer are thus desirable.

SUMMARY

This summary identifies features of some example aspects and is not an exclusive or exhaustive description of the disclosed subject matter. Additional features and aspects are described and will become apparent to persons skilled in the art upon reading the following detailed description and viewing the drawings that form a part thereof.

An apparatus in accordance with at least one embodiment includes a memory configured to receive a data clock from a host via a link and to synchronize the data clock with the host, further comprising; a clock tree buffer configured to toggle based on the data clock to capture write data or to output read data; and a command decoder configured to detect a data clock suspend command while the data clock is synchronized between the host and the memory. The clock tree buffer is configured to disable toggling based on the data clock in response to the command decoder detecting the data clock suspend command.

Another apparatus in accordance with at least one embodiment includes a host coupled to a memory via a link. The host is configured to synchronize a data clock with the memory and to output write data or capture read data based on the data clock. The host includes a memory controller configured to provide a data clock suspend command to the memory via the link while the data clock is synchronized between the host and the memory. The data clock suspend command notifies the memory to disable toggling a clock tree buffer, the clock tree buffer being configured to toggle based on the data clock. The memory controller is further configured to toggle the data clock after providing the data clock suspend command.

A method to reduce power of a data clock for a memory coupled to a host via a link, includes synchronizing a data clock between the host and the memory via a link; toggling, by a clock tree buffer of the memory, based on the data clock to capture write data or to output read data; providing, by the host to the memory via the link, a data clock suspend command, while the data clock is synchronized between the host and the memory; disabling toggling based on the data clock, by the clock tree buffer, in response to the data clock suspend command; and toggling, by the host, the data clock after providing the data clock suspend command.

Another method to reduce power of a data clock for a memory coupled to a host via a link, includes providing, by a host to a memory via a link, a data clock synchronization command and providing, by the host to the memory via the link, a data clock suspend command, after synchronizing a data clock. The data clock suspend command notifies the memory to disable a data clock buffer which toggles based on the data clock. The method further includes toggling, by the host, the data clock after providing the data clock suspend command.

Another method to reduce power of a data clock for a memory coupled to a host via a link, includes receiving a data clock, by the memory, from a host via a link; synchronizing, by the memory, the data clock with the host; toggling, by a clock tree buffer of the memory, based on the data clock to capture write data or to output read data; detecting, by the memory, a data clock suspend command while the data clock is synchronized between the memory and the host; and disabling toggling the clock tree buffer based on the data clock, in response to detecting the data clock suspend command.

BRIEF DESCRIPTION OF THE DRAWINGS

Various aspects of apparatus and methods will now be presented in the detailed description by way of example, and not by way of limitation, with reference to the accompanying drawings, wherein:

FIG. 2 illustrates a data clock synchronization (WCK2CK) command provided by the host to the memory via the link of FIG. 1, in accordance with certain aspects of the disclosure.

DETAILED DESCRIPTION

Figure 1:
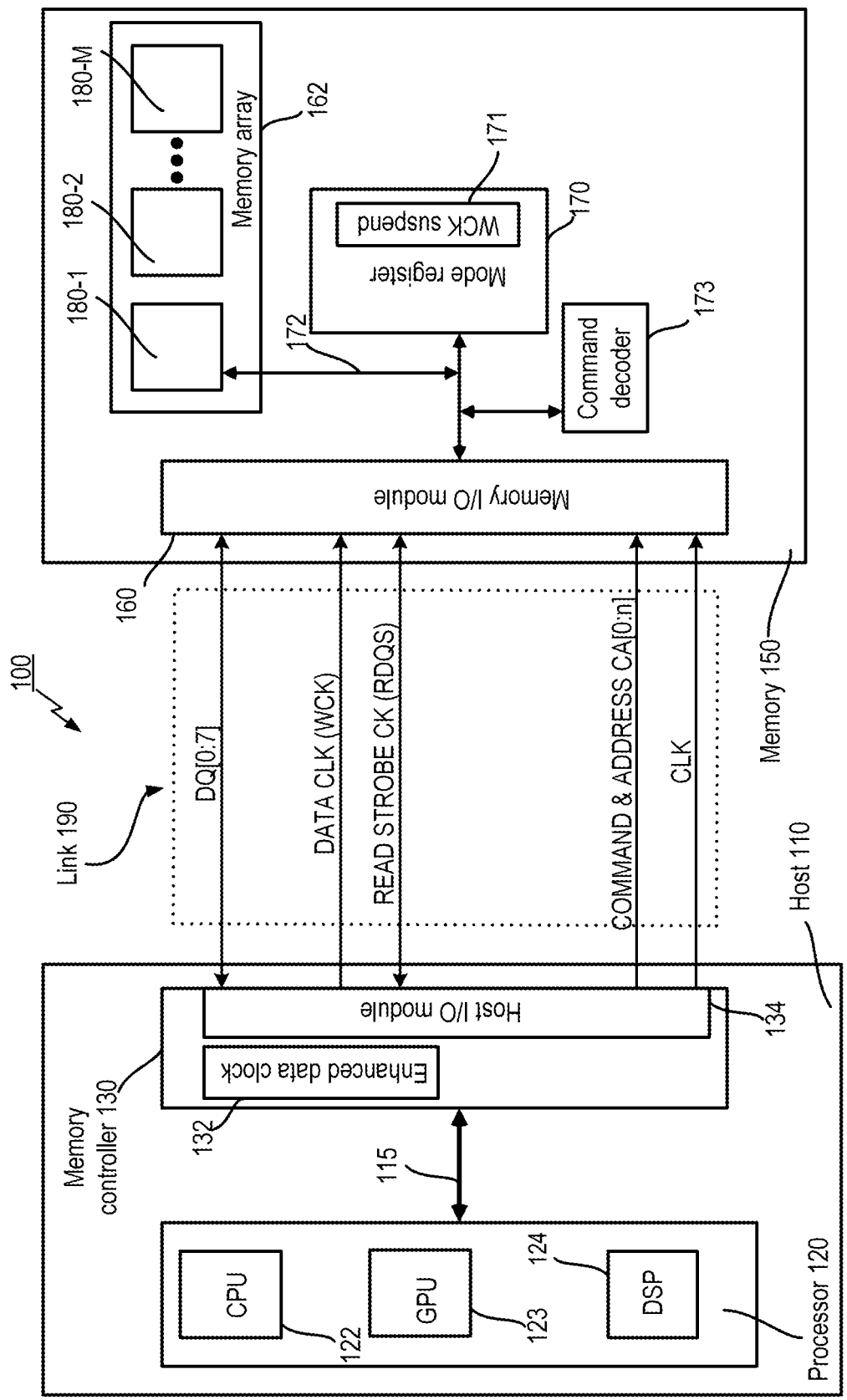
FIG. 1 illustrates an apparatus incorporating at least one processor, a memory, and a link coupling the at least one processor and the memory, in accordance with certain aspects of the disclosure.

The detailed description set forth below in connection with the appended drawings is intended as a description of various configurations and is not intended to represent the only configurations in which the concepts described herein may be practiced. The detailed description includes specific details for providing a thorough understanding of various concepts. However, it will be apparent to those skilled in the art that these concepts may be practiced without these specific details. In some instances, well known structures and components are shown in block diagram form to avoid obscuring such concepts.

As used herein, the term "coupled to" in the various tenses of the verb "couple" may mean that element A is directly connected to element B or that other elements may be connected between elements A and B (i.e., that element A is indirectly connected with element B), to operate certain intended functions. In the case of electrical components, the term "coupled to" may also be used herein to mean that a wire, trace, or other electrically conductive material is used to electrically connect elements A and B (and any components electrically connected therebetween). In some examples, the term "coupled to" mean a transfer of electrical energy between elements A and B, to operate certain intended functions.

In some examples, the term "electrically connected" mean having an electric current or configurable to having an electric current flowing between the elements A and B. For example, the elements A and B may be connected via resistors, transistors, or an inductor, in addition to a wire, trace, or other electrically conductive material and components. Furthermore, for radio frequency functions, the elements A and B may be "electrically connected" via a capacitor.

The terms "first," "second," "third," etc. are employed for ease of reference and may not carry substantive meanings. Likewise, names for components/modules may be adopted for ease of reference and might not limit the components/modules. For example, such non-limiting names may include "clock tree" buffer; "command" decoder; "memory mode" register; and/or "memory" controller. Modules and components presented in the disclosure may be implemented in hardware, software, or a combination of hardware and software.

The term "bus system" may provide that elements coupled to the "bus system" may exchange information therebetween, directly or indirectly. In such fashion, the "bus system" may encompass multiple physical connections as well as intervening stages such as buffers, latches, registers, etc. A module may be implemented in hardware, software, or a combination of hardware and software.

Methods and apparatuses incorporating memories having enhanced data clock operations are presented. A data clock between a host and a memory may be synchronized for the host to access (e.g., read or write) the memory. Once synchronized, the data clock may be in an always-on mode or may be free running to maintain the synchronization. As the memory may include clock trees driven by the data clock, the clock trees consume power when the data clock is running in the always-on mode, even when the host is not accessing the memory.

Enhanced data clock operations presented to allow the memory to gate clock trees while a data clock is in an always-on mode and toggling. The data clock remains synchronized between the host and the memory. Advantageously, power is reduced as the memory gates clock trees without adding cycles for resynchronization, as the data clock remains synchronized.

Methods and apparatuses are presented in the present disclosure by way of non-limiting examples of Low-Power Double Data Rate (LPDDR) Synchronous Dynamic Random Access Memory (SDRAM). For example, the LPDDR memory operating in accordance with LPDDR specification promulgated by Joint Electronic Device Engineering Council (JEDEC). Such LPDDR specification may be LPDDR5.

FIG. 1 illustrates an apparatus 100 incorporating a host 110, a memory 150, and a link 190 coupling the host 110 and the memory 150, in accordance with certain aspects of the disclosure. The apparatus 100 may be, for example, one of computing systems (e.g., servers, datacenters, desktop computers), mobile computing device (e.g., laptops, cell phones, vehicles, etc.), Internet of Things devices, virtual reality (VR) systems, or augmented reality (AR) systems, etc. The host 110 may include at least one processor 120 coupled to the memory 150 via the link 190 to perform a computing function, such as one of data processing, data communication, graphic display, camera, AR or VR rendering, image processing, etc. For example, the memory 150 may store instructions or data for the at least one processor 120 to perform the aforementioned computing functions. The at least one processor 120 may be a collection of processing logics or one or more central processing unit. For example, the at least one processor 120 may be a central processing unit (CPU) 122, a graphic processing unit (GPU) 123, or a digital signal processor (DSP) 124 configured to implement the aforementioned computing functions.

FIG. 1 illustrates that host includes the at least one processor 120 coupled to a memory controller 130 via a bus system 115, the at least one processor 120 being coupled to the memory 150 via the memory controller 130 and the link 190. The memory may be an LPDDR DRAM (e.g., LPDDR5). The host 110, the memory 150, and/or the link 190 may operate according to an LPDDR (e.g., LPDDR5) specification. As presented below, the memory 150 may be configured to receive a data clock (e.g., WCK) from the host 110 via the link 190 and to synchronize the data clock WCK with the host 110 (e.g., to synchronize with a command and address clock from the host 110).

The memory controller 130 may include an enhanced data clock module 132 and a host I/O module 134. The enhanced data clock module 132 may be configured to determine when enhanced data clock operations, such as a data clock suspend mode, is beneficial and to issue a data clock suspend command to enter the data clock suspend mode. The host I/O module 134 may be configured to drive and to receive signals on the link 190. The host I/O module 134 may be known as a PHY layer and be configured to control electrical characteristics (e.g., voltage levels, phase, delays, frequencies, etc.) or to receive signals based on the electrical characteristics of signaling on the link 190. In some examples, the host I/O module 134 may be configured to output write data to the memory 150 via the link 190 based on a data clock WCK. For example, the host I/O module 134 may be configured to output write data synchronized with the data clock WCK. In some examples, the host I/O module 134 may be configured to capture read data from the memory 150 via the link 190 based on a data clock WCK. For example, the host I/O module 134 may be configured such that a buffer to capture (e.g., to sample) read data is clocked or based on the data clock WCK.

In some examples, the link 190 may be a chip-to-chip or a die-to-die link between the host 110 and the memory 150, the host 110 and the memory 150 being on different dies. In some examples, the link 190 may be an in-die link, the host 110 and the memory 150 being on a same die. For example, the link 190 may include multiple signal lines, including signal lines to transmit unidirectional signals from the host 110 to the memory 150 (e.g., data clock (WCK), command and address (CA), CA clock (CLK) etc.) and bidirectional directional signals (data (DQ), data strobe (DQS), etc.). For example, the CA may include a CAS signaling/pin, a chip select (CS) signaling/pin, and column address (CA) signaling. The link 190 and signaling between the host 110 and the memory 150 may be in accordance with the JEDEC DRAM specification (e.g., LPDDR5). In some examples, the memory 150 may use the data clock WCK to capture or to sample write data (e.g., received at the DQs) for write operation and to toggle read data (e.g., outputted at the DQs) for read operation. Thus, the memory 150 may utilize the data clock WCK to capture write data or to output read data.

FIG. 1 illustrates the memory 150 having a memory I/O module 160, a memory array 162, a mode register 170, and a command decoder 173 coupled via a bus system 172. The memory I/O module 160 may be configured to drive and to receive signals on the link 190. The memory I/O module 160 may be known as a PHY layer and be configured to control electrical characteristics (e.g., voltage levels, phase, delays, frequencies, etc.) or to receive signals based on the electrical characteristics of signaling on the link 190. For example, memory I/O module 160 may be configured to capture (e.g., to sample) write data from the host 110 via the link 190 based on the data clock WCK. In some examples, memory I/O module 160 may be configured to clock buffer to capture write data clocked based on the data clock WCK. In some examples, the memory I/O module 160 may be configured to output read data to the host 110 via the link 190 based on a data clock WCK. For example, the host I/O module 134 may be configured to synchronize outputting read data with the data clock WCK.

The memory array 162 may include multiple memory cells (e.g., DRAM memory cells) that store data. The at least one processor may read data stored in and/or write data into the memory array 162, via the link 190. The memory array 162 may be arranged into multiple memory banks 180-1 to 180-M. The memory array 162 may be accessed (e.g., read or written) via a READ or a WRITE command.

The mode register 170 may include register or register that store values on operations, signaling characteristics, and/or information of the memory 150. The mode register 170 may be accessed (e.g., read or written) via a mode register read (MRR) or a mode register write (MRW) command, the MRR and MRW commands being different from the READ and WRITE commands (e.g., the MRR and MRW commands do not access the memory array 162 (FIG. 1)). For example, the memory controller 130 may issue an MRW command via the link 190 to set up the memory 150 for a read or write operation. In response to the MRW command, the memory 150 stores operands or OPs provided by the MRW command into the mode register 170.

In some examples, the MRR command and the MRW command do not access the memory array 162. For example, operands written into or read from the mode register 170 are not written into or read from the memory array 162. The mode register 170 includes a WCK suspend register 171. The WCK suspend register 171 may be configured to store information of a data clock (WCK) suspend command. For example, the WCK suspend register 171 may be configure may store a value indicating whether the memory 150 supports or enables enhanced data clock WCK operations, such as the data clock (WCK) suspend command.

For a write operation, the at least one processor 120 may issue a write request to the memory controller 130 via the bus system 115. The memory controller 130 may issue a WRITE command via CA and CLK of the link 190 to the memory 150. Write data are provided by the memory controller 130 via DQs of the link 190, clocked by the data clock WCK. In response, the memory 150 stores the write data into the memory array 162, addressed by the WRITE command.

For a read operation, the at least one processor 120 may issue a read request to the memory controller 130 via the bus system 115. The memory controller 130 may issue a READ command via CA (e.g., clock CLK, address, command) of the link 190 to the memory 150. In response, the memory 150 outputs data stored in the memory array 162, addressed by the READ command, to the at least one processor 120. The data may be outputted via DQs of the link 190, clocked by the data clock WCK (and/or RDQS). The memory 150 (e.g., the memory I/O module 160) may receive the data clock WCK from the host 110 and use internal clock trees to drive and to buffer the internal data clock WCK to clock the DQs.

The data clock WCK may operate at a different frequency from the CA clock CLK. For example, the data clock WCK may operate at two or four times a frequency of CLK, according to LPDDR5. The memory 150 may use a frequency divider to match the frequency of WCK clock trees with CLK. Such function may require synchronization of states of the CA clock CLK with the internal WCK clock trees. The process may be known as WCK2CK Synchronization (e.g., in LPDDR5 specification) and may require several synchronization cycles.

The host 110 (e.g., the memory controller 130) may start the WCK2CK Synchronization by issuing a WCK2CK SYNC command, via the link 190. The WCK2CK SYNC command may be a CAS command. For example, toggling a CAS signal of the command and address (CA) preceding to a read or write command. For example, the read or write command may following immediately the CAS command of the WCK2CK SYNC command. In response, the host 110 and the memory 150 engage in synchronization cycles with the data clock WCK clocking (e.g., toggling).

Having established synchronization via the WCK2CK Synchronization, the data clock WCK may be always on (e.g., free-running) to keep synchronization. As long as the data clock WCK clocks (e.g., toggles), the data clock WCK would remain synchronized between the host 110 and the memory 150. The WCK2CK Synchronization may be exited by the memory 150 receiving commands for power down, self-refresh power-down, deep-sleep commands, or reset. Such always-on mode of the data clock WCK would improve performance, as subsequent read and write commands would not require resynchronization. However, as the data clock WCK toggles, the memory 150 continues to draw current arising from toggling of internal WCK clock trees, even when the memory 150 is idle (e.g., not reading or writing).

The command decoder 173 may be configured to decode various commands provided by the host 110 (e.g., the memory controller 130) via the link 190. For example, the command decoder 173 may be configured to decode a read command, a write command, and the various WCK2CK commands presented above.

FIG. 2 illustrates a data clock synchronization (WCK2CK SYNC) command provided by the host 110 to the memory 150 via the link 190 of FIG. 1, in accordance with certain aspects of the disclosure. FIG. 2 includes a diagram 210 of the WCK2CK SYNC command issued as a CAS command and a diagram 220 of modes of the (WCK2CK SYNC) CAS command. The diagram 210 illustrates that the (WCK2CK SYNC) CAS command is operable on any bank configuration. At a clock CK rising edge, a CS pin is high, and operands of the WCK2CK SYNC command are provided at address CA0-CA6. At a clock CK falling edge, additional operands are inputted. The operands (e.g., variables, fields, or values indicating certain aspects of the WCK2CK SYNC command) may include DC0-DC3, WS_WR, WS_RD, WS_FS, WRX, WXS, B3 as provided by the LPDDR5 specification. For example, WS_WR at logic one may indicate that a write command immediately follows the WCK2CK SYNC command. The A WS_RD at logic one may indicate that a read command immediately follows the WCK2CK SYNC command. WS_FS may indicate a fast synchronization. WRX and WXS may indicate a Write X function (e.g., WRX and/or WXS may be operands for Write X function). B3 may indicate a read burst starting address.

The diagram 220 illustrates that the modes of the (WCK2CK SYNC) CAS command may include WCK2CK SYNC for WRITE (e.g., WS_WR is logic one), WCK2CK SYNC for READ (e.g., WS_RD is logic one), FAST WCK2CK SYNC (e.g., WS_FS is logic one), and WCK2CK SYNC OFF (a command to end WCK synchronization and to turn off internal WCK clock trees in the memory 150). The (WCK2CK SYNC) CAS command is further enhanced with a data clock suspend (WCK SUSPEND mode. For example, the (WCK2CK SYNC) CAS command may enter the WCK SUSPEND mode with WS_WR at logic one, WS_RD at logic zero, and WS_FS at logic one. For ease of reference, a WCK2CK SYNC command with such WCK SUSPEND mode may be referred to as a data clock (WCK) suspend command. The data clock (WCK) suspend command signals to the memory 150 to turn off at least one internal WCK clock tree to the memory 150, even though the data clock WCK continues to clock (e.g., toggle). In such fashion, the at least one internal WCK clock tree stops toggling, and power consumption is saved while WCK synchronization is maintained. No new WCK synchronization is required to perform a read or write operation subsequent to the WCK SUSPEND mode.

For LPDDR5 dual rank configuration, the memory controller 130 may be configured to enable the enhanced data clock (WCK) operations with LPDDR5 WCK2CK SYNC broadcast feature. For example, CAS-WCK_SUS is broadcasted to both ranks (Rank 0 and 1) together for better command and address (CA) bus efficiency.

In some examples, the mode register 170 (FIG. 1) may include a field to indicate that the data suspend (WCK SUSPEND) mode is supported or enabled. See, for example, the WCK suspend register 171 in FIG. 1. The host 110 (e.g., the memory controller 130) may issue a mode register read (MRR) command via the link 190 to read the WCK suspend register 171 within the mode register 170 and to determine whether the memory 150 supports the clock data suspend (WCK SUSPEND) mode, based on a value or operand stored in the WCK suspend register 171.

In some examples, the clock data suspend (WCK SUSPEND) mode may be exited by a subsequent read or write command. In response to the subsequent read or write command (while in the clock data suspend mode), the memory 150 may restart the at least on internal WCK clock tree toggling. No performance is lost, as no additional clock cycles are needed to exit the clock data suspend (WCK SUSPEND) mode.

Figure 3:
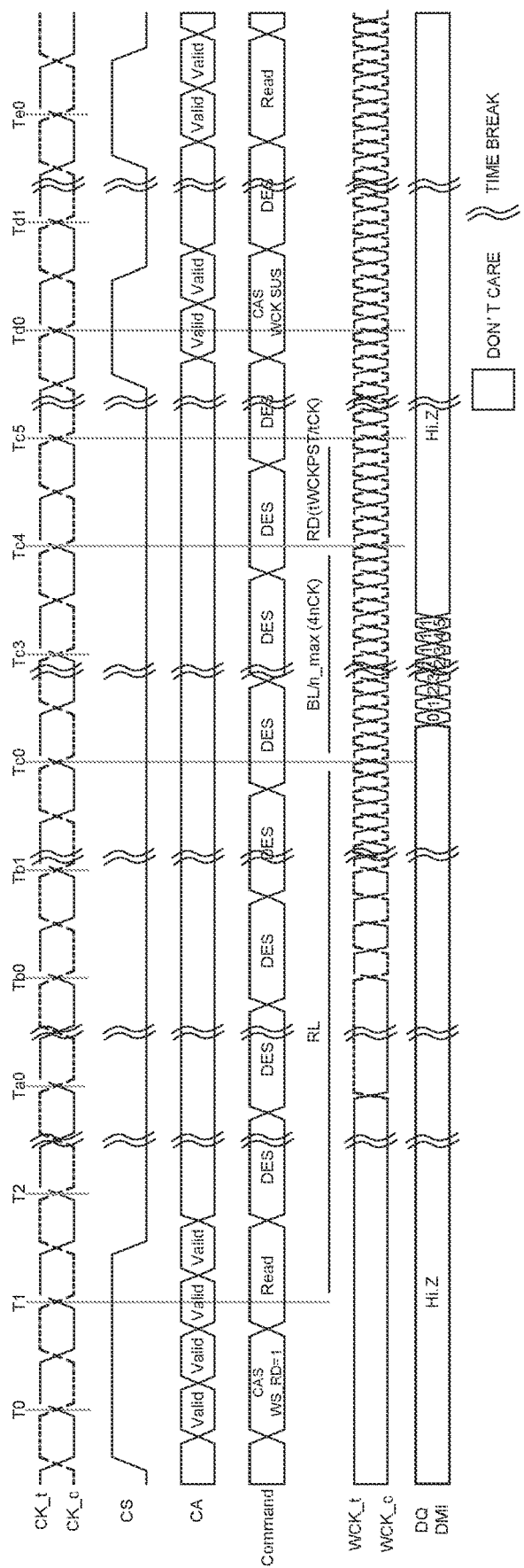
FIG. 3 illustrates waveforms of data clock (WCK) synchronization with data suspend (WCK SUSPEND) mode, in accordance with certain aspects of the present disclosure.

FIG. 3 illustrates waveforms of WCK synchronization with the WCK SUSPEND mode, in accordance with certain aspects of the present disclosure. In FIG. 3, read operations are provided as examples. Write operations may be implemented in similar fashion. At $T_0$ (and at $T_{0\_f}$, a falling edge of clock CK), the host 110 (e.g., the memory controller 130) issues a WCK2CK SYNC command to the memory 150 via the link 190, with WS_RD at logic one. In an immediate subsequent clock cycle, $T_1$, the host 110 (e.g., the memory controller 130) issues a read command to the memory 150 via the link 190. As a result, the host 110 and the memory 150 enter data clock WCK synchronization (WCK2CK) cycles. At $T_{b1}$, the data clock WCK is synchronized between the host 110 and the memory 150. Subsequently, the host 110 continues to clock (e.g., to toggle) the data clock WCK to keep synchronization. The host 110 (e.g., the memory controller 130) may issue additional read or write commands to the memory 150 via the link 190 without further data clock WCK synchronization.

At $T_{d0}$ (and at $T_{0\_f}$, a falling edge of clock CK), the host 110 (e.g., the memory controller 130) issues a clock data suspend (WCK SUSPEND) command (specifying the WCK SUSPEND mode) to the memory 150 via the link 190 to enter the WCK SUSPEND mode. In response, the memory 150 may stop at least one internal WCK clock tree from toggling. In such fashion, power consumption within the memory 150 is reduced.

Subsequent to entering the WCK SUSPEND mode, at $T_{e0}$, the host 110 (via the memory controller 130) issues a read command (or a write command). In response to the read/write command, the memory 150 starts the one or more internal WCK clock tree toggling, and the read/write operation commences normally. There are no changes to the read/write operation.

Figure 4:
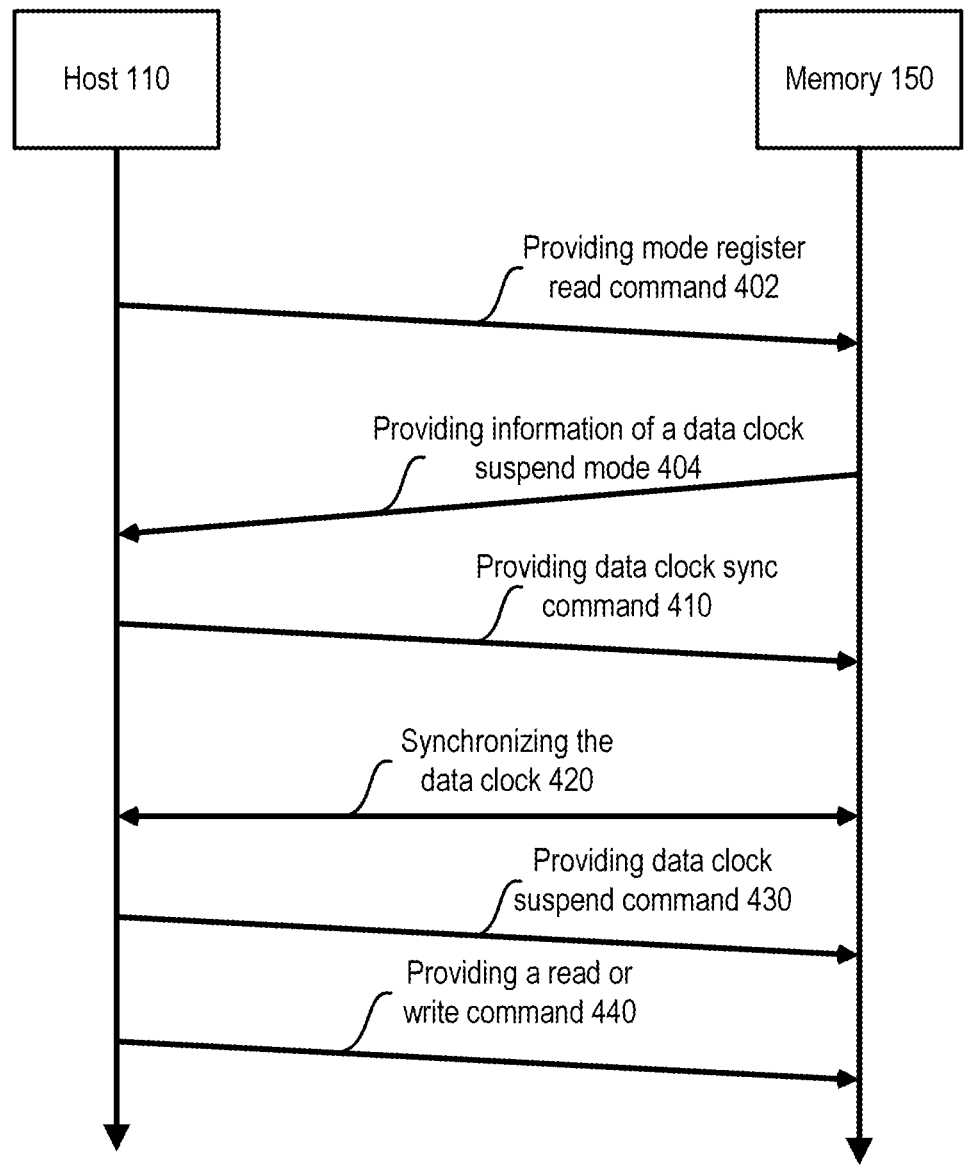
FIG. 4 illustrates operations and communications of data clock (WCK) suspend mode between the host and the memory over the link of FIG. 1, in accordance with certain aspects of the present disclosure.

FIG. 4 illustrates operations and communications of data clock (WCK) suspend mode between the host 110 and the memory 150 over the link 190 of FIG. 1, in accordance with certain aspects of the present disclosure. At 402, the host 110 (e.g., the memory controller 130) provides a mode register read command to the memory 150 via the link 190. For example, the mode register read command may be directed to read a WCD suspend register 171 of the mode register 170. At 404, the memory 150 provides to the host 110 via the link 190 information of a data clock (WCK) suspend command stored in, for example, the WCD suspend register 171 of the mode register 170. The information of the data clock (WCK) suspend command may indicate whether the memory 150 supports the data clock (WCK) suspend command.

At 410, the host 110 (e.g., the memory controller 130) provides a data clock synchronization (WCK2CK SYNC) command to the memory 150 via the link 190. See $T_0$, FIG. 3. For example, referring to diagram 220 of FIG. 2, the WCK2CK SYNC command may be WCK2CK SYNC for READ with operands WS_WR at logic zero, WS_RD at logic one, and WS_FS at logic zero. The host 110 (e.g., the memory controller 130) may be configured to use the data clock WCK to output (e.g., to synchronize with) write data and/or to capture (e.g., to sample) read data. The memory 150 (e.g., the memory I/O module 160) may be configured to receive the data clock WCK and be configured to capture (e.g., to sample) write data and/or to output (e.g., to synchronize with) read data. The memory 150 may include one or more internal data clock trees incorporating one or more clock tree buffers. The clock tree buffer is configured to toggle based on the data clock WCK (e.g., toggle with the data clock WCK) to capture write data or to output read data. The one or more clock tree buffers are configured to drive internal data clock WCK within the memory 150 to perform, for example, capturing write data and/or outputting (e.g., synchronizing with) read data.

At 420, the host 110 and the memory 150 are synchronized (e.g., in WCK2CK synchronization). See, for example, synchronization cycles between $T_{b0}$ and $T_{b1}$. For example, the memory controller 130 may be configured to perform the synchronization cycles in accordance with an LPDDR5 specification to synchronize the data clock WCK with the memory 150 (e.g., to synchronize with the CA clock CLK with intern data clock of the memory 150; e.g., both are at a same state). At 430, the host 110 (e.g., the memory controller 130) provides a data clock (WCK) suspend command to the memory 150 via the link 190, and the memory 150 enters a data clock (WCK) suspend mode. For example, the memory 150 may be configured to receive and decode the data clock (WCK) suspend command, subsequent to synchronizing the data clock (e.g., WCK) between the host 110 and the memory 150 and/or while the data clock (e.g., WCK) is synchronized between the host 110 and the memory 150. See $T_{d0}$, FIG. 3. The host 110 (e.g., the memory controller 130) may be configured to continue to toggle the data clock WCK after providing the data clock (WCK) suspend command. In response to the data clock (WCK) suspend command, the memory 150 may enter a data clock (WCK) suspend mode. For example, the memory 150 may be configured to disable the clock tree toggling based on the data clock WCK, to reduce power consumption.

At 440, the host 110 (e.g., the memory controller 130) provides a read (or write) command to the memory 150 via the link 190, subsequent to providing the data clock (WCK) suspend command and without performing synchronization between the host 110 and the memory 150. See $T_{e0}$, FIG. 3. The read command at $T_{eo}$ is provided by the host 110 subsequent to providing the data clock (WCK) suspend command at $T_{do}$. The host 110 and the memory 150 do not perform synchronization of the data clock WCK (no synchronization cycles) between providing the data clock (WCK) suspend command at $T_{d0}$ (at 430) and providing the read or write command at $T_{do}$ (at 440). No synchronization cycles were needed between 430 and 440 because the data clock WCK remains synchronized in the data clock (WCK) synchronization suspend mode, as long as the host 110 toggles the data clock (WCK). In response to the read (or write) command, the memory 150 performs a read (or write) operation. The memory 150 may use clocks powered by the one or more clock tree buffer toggling based on the data clock WCK to output (e.g., synchronize with) read data and/or to capture write data.

Figure 5:
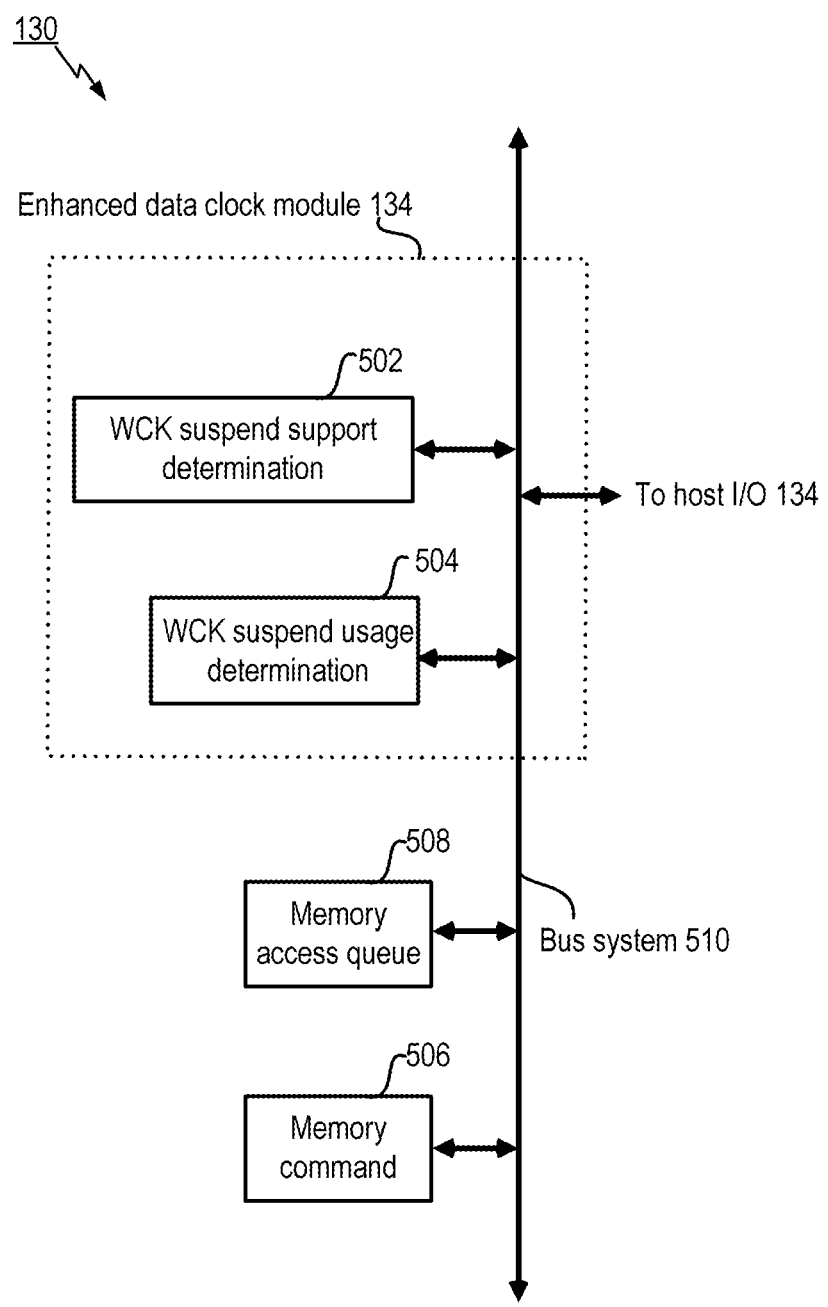
FIG. 5 illustrates portions of the memory controller, including the enhanced data clock module, of FIG. 1 operating the data clock synchronization (WCK2CK) suspend mode, in accordance with certain aspects of the present disclosure.

FIG. 5 illustrates portions of the memory controller 130, including the enhanced data clock module 132, of FIG. 1 operating the data clock synchronization (WCK2CK) suspend mode, in accordance with certain aspects of the present disclosure. FIG. 5 illustrates that the memory controller 130 includes a memory command module 506, a memory access queue module 508, and the enhanced data clock module 132. The enhanced data clock module 132 may include some or all of a WCK suspend support determination module 502 and a WCK suspend usage determination module 504. The modules are coupled by a bus system 510, via which the modules communicate. The bus system 410 is further coupled to the host I/O module 134.

The memory command module 506 may be configured to provide various commands to the memory 150 via the link 190 (and via the host I/O module 134). For example, the memory command module 506 may be configured to provide a mode register read command (e.g., for information of the data clock suspend command; see FIG. 4 at 402), a data clock (WCK) synchronization command (see FIG. 4 at 410), a data clock (WCK) suspend command (e.g., based on the information of the data clock suspend command and/or while the data clock WCK is synchronized between the host 110 and the memory 150; see FIG. 4 at 430), and/or a read (or write) command to instruct the memory 150 to perform a read (or write) operation (e.g., subsequent to providing the data clock suspend command and/or without performing synchronization of the data clock WCK between providing the data clock suspend command and providing the read or write command; see FIG. 4 at 440). The memory access queue module 508 may be, for example, one or more storage elements and may be configured to store one or more memory access commands or instructions.

The WCK suspend support determination module 502 may be configured to determine whether the memory 150 supports enhanced data clock operations, such as the data clock (WCK) suspend mode. For example, at 402 of FIG. 4, the WCK suspend support determination module 502 may receive information of the data clock (WCK) suspend module stored in the mode register 170 (e.g., WCK suspend register 171) of the memory 150. The information of the data clock (WCK) suspend module may indicate whether the memory 150 supports the data clock suspend command.

the WCK suspend usage determination module 504 may be configured to determine whether to use the data clock (WCK) suspend mode (e.g., whether to provide the data clock (WCK) suspend command), based on the information of the data clock suspend command. In a case that the information of the data clock suspend command indicates that the memory 150 supports the data clock (WCK) suspend mode, the WCK suspend usage determination module 504 may look into the memory access queue module 508 to determine whether power saving from the data clock (WCK) suspend mode is sufficient to justify entering the data clock (WCK) mode. The WCK suspend usage determination module 504 may make such determination based on types, numbers, timing (e.g., difference in timing) of commands or instructions stored in the memory access queue module 508.

For example, if memory access commands or instructions were determined to take place frequently, power saving in such case might not justify entering the data clock (WCK) suspend mode. Alternative, if a next memory access (read or write) were determined, from the memory access queue module 508, to be needed after a first time period, then the host 110 (e.g., the WCK suspend usage determination module 504) might determine that a power saving would justify entering into the data clock (WCK) suspend mode and cause the memory command module 506 to provide the data clock (WCK) suspend command (e.g., operands of WS_WR and WS_FS at logic one and WS_RD at logic zero) to the memory 150 via the link 190 (and via the host I/O module 134). In other words, a (next) read or write command may be provided at or later than the first time period after the data clock (WCK) suspend command. For example, the host 110 may be configured to provide the (next) read or write command after the first time period, after providing the data clock (WCK) suspend command.

Alternatively, if the (next) read or write command were to be provided after a second time period longer than the first time period, then the WCK suspend usage determination module 504 may be configured to determine that exiting data clock synchronization (WCK2CK) might save more power. In such case, the host 110 (e.g., the WCK suspend usage determination module 504) might opt to not cause the memory command module 506 to provide the data clock (WCK) suspend command. The host 110 (e.g., the WCK suspend usage determination module 504) might cause the memory command module 506 to provide an instruct to the memory 150 via the link 190 to exit the data clock synchronization (WCK2CK)(e.g., power down). In such fashion, host 110 may be configured to provide the (next) read or write command to the memory 150 via the link 190 between the first time period and the second time period after providing the data clock (WCK) suspend command.

Figure 6:
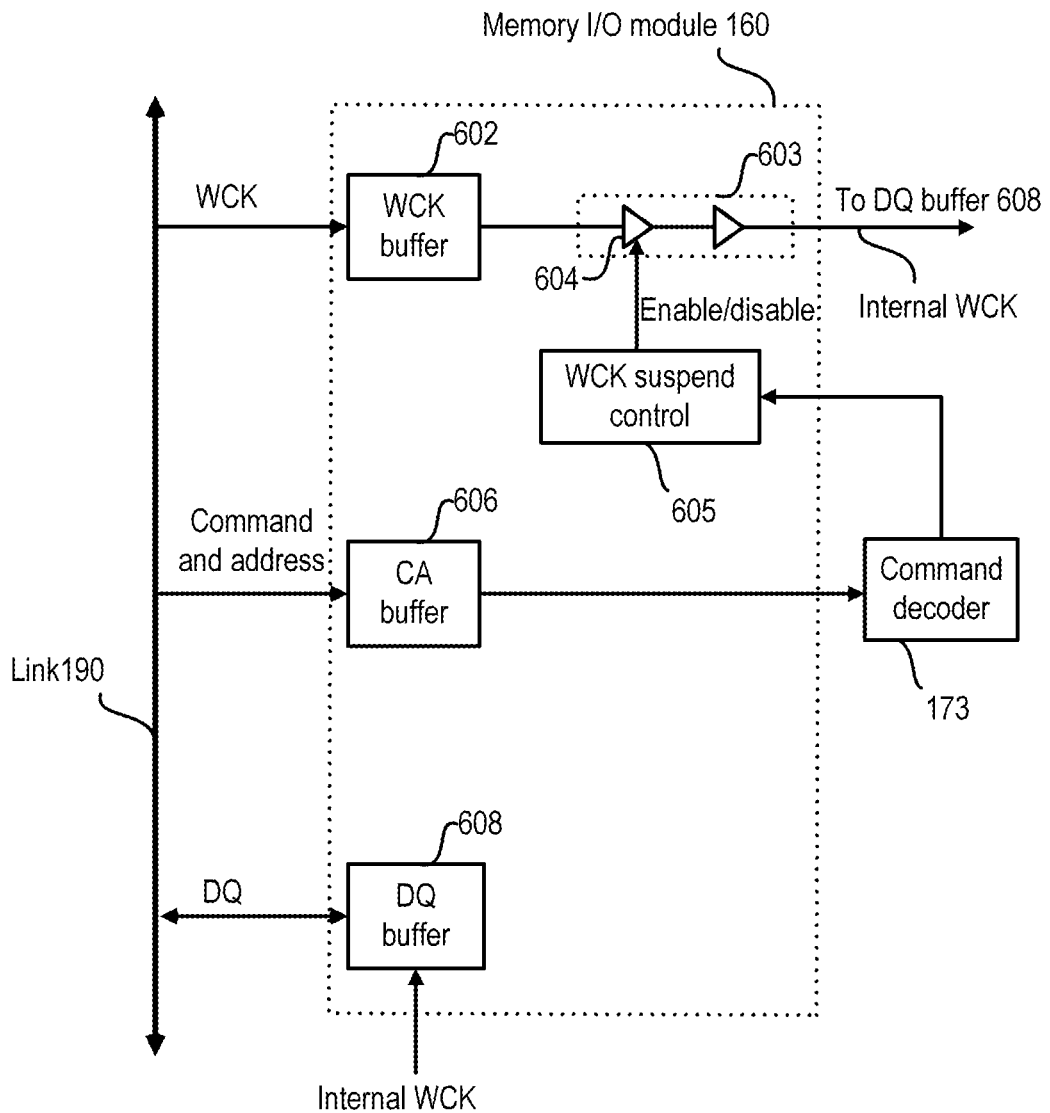
FIG. 6 illustrates portions of the memory I/O module 160 of FIG. 1 operating the data clock (WCK) suspend mode, in accordance with certain aspects of the present disclosure.

FIG. 6 illustrates portions of the memory I/O module 160 of FIG. 1 operating the data clock (WCK) suspend mode, in accordance with certain aspects of the present disclosure. FIG. 6 illustrates that the memory I/O module 160 includes a WCK buffer 602, a CA buffer 606, and a DQ buffer 608 (the memory I/O module 160 may include multiple instances of these buffers). FIG. 6 further illustrates that the memory I/O module 160 includes a clock tree 603 and the WCK suspend control module 605.

The WCK buffer 602 may be an input buffer/receiver configured to receive the data clock WCK and be configured to output to the clock tree 603. The clock tree 603 may be configured to toggle with the received data clock WCK and outputs an internal WCK to the DQ buffer 608. The clock tree 603 includes one or more clock tree buffer 604 configured to toggle based the data clock WCK (e.g., toggle with the data clock WCK) to capture write data or to output read data. In some examples, the clock tree buffer 604 may be after (e.g., receiving an output directly or indirectly from) the WCK buffer 602 (i.e., after the memory I/O module 160). The DQ buffer 608 may be an input/output buffer configured to receive write data from and output read data to the DQs of the link 190. The DQ buffer 608 may be configured to be clocked by the internal WCK (or clocked based upon the internal WCK). For example, the DQ buffer 608 may be configured to capture (e.g., to sample) write data based on the internal WCK (which is in turn based on the data clock WCK) and/or configured to output based on (e.g., to synchronize outputs with) the internal WCK (which is in turn based on the data clock WCK).

The CA buffer 606 may be an input buffer/receiver configured to receive command and address inputs from the link 190 and configured to output to the command decoder 173. The command decoder 173 may be configured to detect, for example, a mode register read command (e.g., for information of the data clock suspend command; see FIG. 4 at 402), a data clock synchronization (e.g., WCK2CK) command (see FIG. 4 at 410), a data clock (WCK) suspend command (e.g., based on the information of the data clock (WCK) suspend command and/or while the data clock WCK is synchronized between the host 110 and the memory 150; see FIG. 4 at 430), and/or a read (or write) command to instruct the memory 150 to perform a read (or write) operation (e.g., subsequent to detecting the data clock (WCK) suspend command without performing synchronization of the data clock WCK between detecting the data clock (WCK) suspend command and detecting the read or write command; see FIG. 4 at 440).

In some examples, the data clock (WCK) suspend command notifies the memory 150 to disable toggling the clock tree buffer 604, the clock tree buffer 604 being configured to toggle based on the data clock WCK. Thus, in response to the command decoder 173 detecting the data clock (WCK) suspend command, the WCK suspend control module 605 disable the clock tree buffer 604 from toggling. The clock tree buffer 604 is therefore configured to disable toggling based on the data clock WCK in response to the command decoder 173 detecting the data clock (WCK) suspend command. In such fashion, clocking power consumed by the clock tree 603 is saved.

In some examples, the read or write command subsequent to the data clock (WCK) suspend command notifies the memory 150 to start toggling the clock tree buffer 604. Thus, in response to the command decoder 173 detecting the read or write command subsequent to the data clock (WCK) suspend command, the WCK suspend control module 605 enables the clock tree buffer 604 to start toggling based on the data clock WCK. Thus, the clock tree buffer 604 is configured to start toggling based on the data clock WCK in response to the command decoder 173 detecting the read or write command (subsequent to the data clock (WCK) suspend command). Further, the memory 150 is configured to perform a read (or write) operation (e.g., read from or write to the memory array 162 of FIG. 1) in response to the command decoder 173 detecting the read or write command. In such fashion, performance of the memory 150 is not impeded as no additional synchronization cycles are needed.

Figure 7:
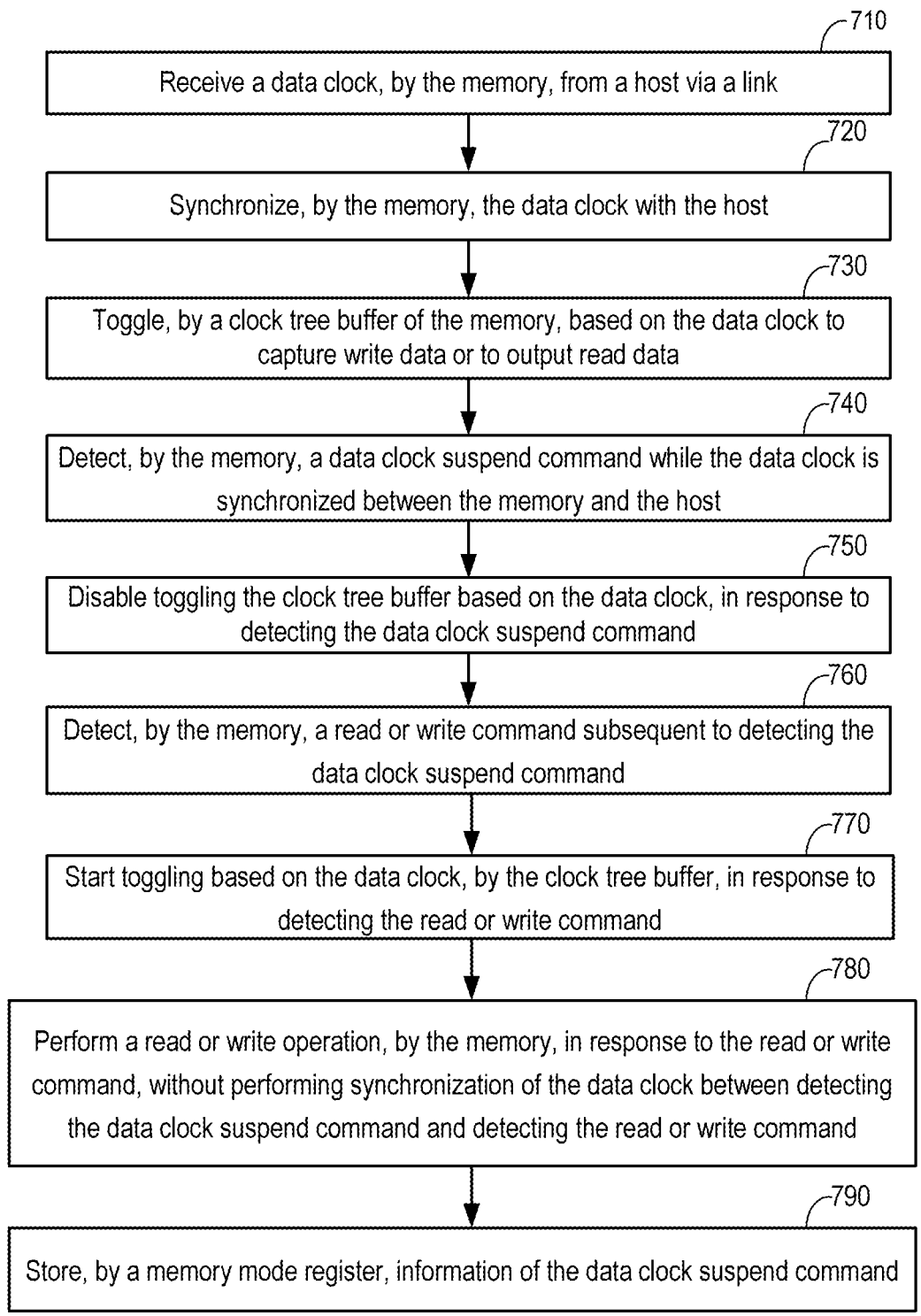
FIG. 7 illustrates a method reduce power of a data clock (WCK) for the memory coupled to the host via the link 190 of FIG. 1, in accordance with certain aspects of the disclosure.

FIG. 7 illustrates a method reduce power of a data clock (WCK) for the memory 150 coupled to the host 110 via the link 190 of FIG. 1, in accordance with certain aspects of the disclosure. The operations of FIG. 7 may be implemented by, for example, the apparatus 100 (e.g., the memory 150) presented with FIGS. 1-6. The arrows indicate certain relationships among the operations, but not necessarily sequential relationships.

At 710, a data clock is received by the memory from a host via a link. See, for example, FIG. 1 and FIG. 6, the WCK buffer receives the data clock WCK from the host 110 via the link 190. At 720, the data clock is synchronized by the memory with the host. See, for example, the synchronization cycles between $T_{b0}$ and $T_{b1}$ of FIGS. 3 and 420 at FIG. 4. At 730, a clock tree buffer of the memory is toggled based on the data clock to capture write data or to output read data. See, for example, the clock tree buffer 604 toggles based on the data clock WCK to capture write data or to output read data.

At 740, a data clock suspend command is detected by the memory while the data clock is synchronized between the memory and the host. See, for example, FIG. 4 at 430. Moreover, referring to FIG. 6, the command decoder 173 detects the data clock (WCK) suspend command (e.g., a WCK2CK command with operands WS_WR and WS_FS at logic one and WS_RD at logic zero). At 750, toggling the clock tree buffer is disabled based on the data clock, in response to detecting the data clock suspend command. Referring to FIG. 6, toggling of the clock tree buffer 604 is disabled, by the WCK suspend control module 605, in response to the command decoder 173 detecting the data clock (WCK) suspend mode.

At 760, a read or write command is detected by the memory subsequent to detecting the data clock suspend command. See, for example, FIG. 4 at 440. Referring to FIG. 6, the command decoder 173 detects a read (or write) command subsequent to detecting the data clock WCK suspend command. At 770, toggling based on the data clock, by the clock tree buffer, is started in response to detecting the read or write command. Referring to FIG. 6, the clock tree buffer 604 starts toggling based on the data clock WCK (enabled by the WCK suspend control module 605), in response to the command decoder 173 detecting the read or write command.

At 780, a read or write operation is performed by the memory, in response to the read or write command, without performing synchronization of the data clock between detecting the data clock suspend command and detecting the read or write command. See FIG. 4 at 440. The memory 150 performs a read or write operation in accordance with the read or write command without performing synchronization of the data clock WCK between detecting the data clock (WCK) suspend command and detecting the read or write command. No such synchronization is needed because the host 110 and the memory 150 remain in a WCK2CK mode (data clock synchronization mode). At 790, information of the data clock suspend command is stored by a memory mode register. Referring to FIG. 1, the mode register 170 includes the WCK suspend register 171, which stores information on whether the memory 150 supports enhanced data clock WCK operations, such as the data clock (WCK) suspend command.

Figure 8:
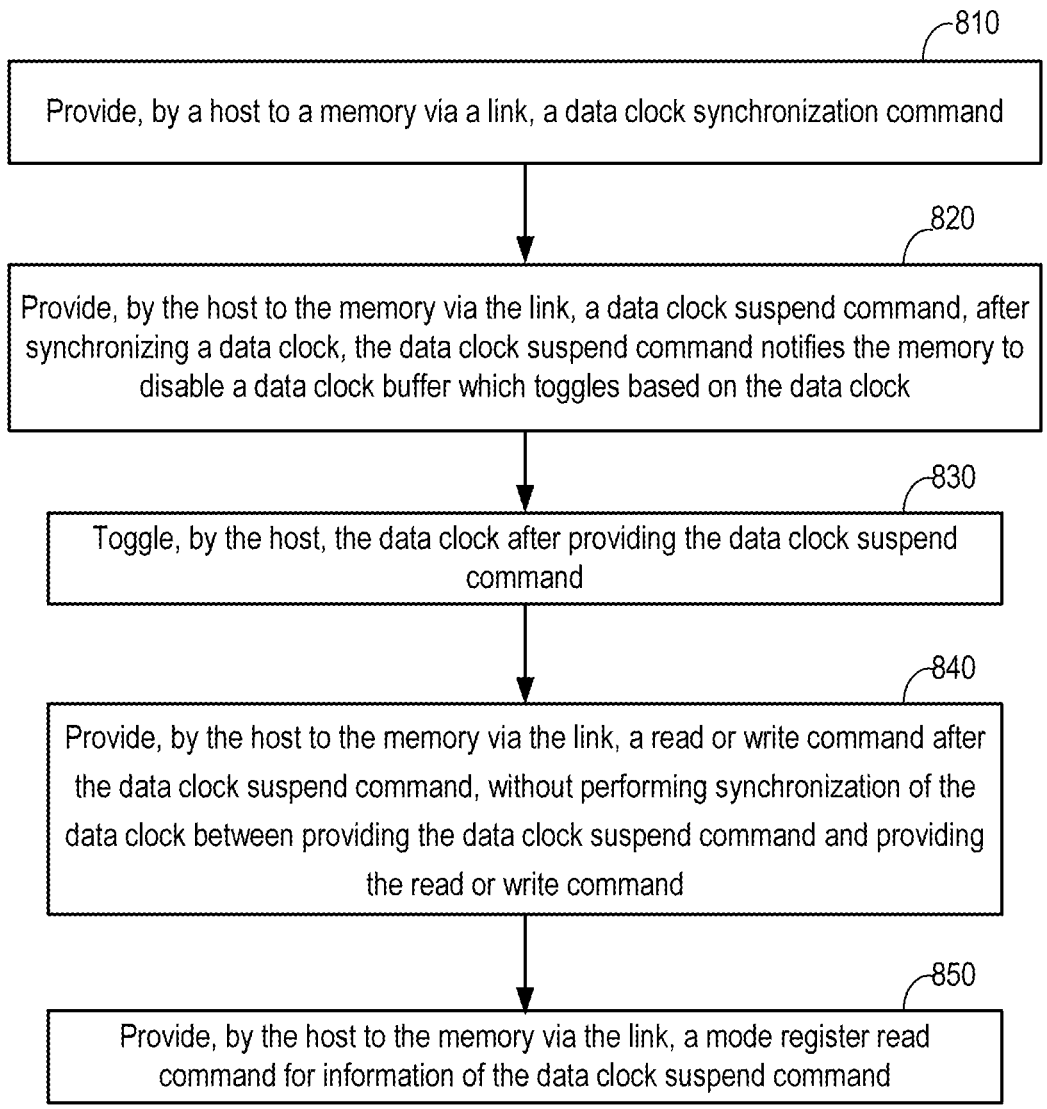
FIG. 8 illustrates a method reduce power of a data clock (WCK) for the memory coupled to the host via the link of FIG. 1, in accordance with certain aspects of the disclosure.

FIG. 8 illustrates a method reduce power of a data clock (WCK) for the memory 150 coupled to the host 110 via the link 190 of FIG. 1, in accordance with certain aspects of the disclosure. The operations of FIG. 7 may be implemented by, for example, the apparatus 100 (e.g., the host 110) presented with FIGS. 1-6. The arrows indicate certain relationships among the operations, but not necessarily sequential relationships. Operations of FIG. 7 and FIG. 8 may be combined as presented in the present disclosure.

At 810, a data clock synchronization command is provided by a host to a memory via a link. See, for example, FIG. 4 at 410. Referring to FIG. 5, the memory command module 506 provides the data clock synchronization command (e.g., WCK2CK for READ or WCK2CK for WRITE; see FIG. 2) to the memory 150 via the link 190. At 820, a data clock suspend command is provided by the host to the memory via the link after synchronizing a data clock. The data clock suspend command notifies the memory to disable a data clock buffer which toggles based on the data clock. See, for example, FIG. 4 at 430. Referring to FIG. 5, the memory command module 506 provides the data clock (WCK) suspend command to the memory 150 via the link 190, after synchronizing the data clock with the memory 150 (e.g., FIG. 4 at 420). Referring to FIG. 6, the command decoder 173 detects the data clock (WCK) suspend command and causes the WCK suspend control module 605 to disable the clock tree buffer 604 from toggling, which toggles based on the data clock WCK.

At 830, the data clock is toggled by the host after providing the data clock suspend command. Referring to FIG. 3, the host 110 continues to toggle the data clock WCK after providing the data clock suspend command at $T_{d0}$. Accordingly, the host 110 and the memory 150 remain in the data clock synchronization mode (WCK2CK mode), and synchronization cycles are needed for a subsequent read or write operation.

At 840, a read or write command is provide by the host to the memory via the link after the data clock suspend command, without performing synchronization of the data clock between providing the data clock suspend command and providing the read or write command. See, for example, FIG. 4 at 440. At 850, the data clock suspend command is provided in response to the information of the data clock suspend command. See, for example FIG. 4 at 430.

Appendix I, II, and III are attached and incorporated by reference in its entirety.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus, comprising:
   a memory configured to receive a data clock from a host via a link and to synchronize the data clock with the host, further comprising:
   a clock tree buffer configured to toggle based on the data clock to capture write data or to output read data; and
   a command decoder configured to detect a data clock suspend command while the data clock is synchronized between the host and the memory, wherein the clock tree buffer is configured to disable toggling based on the data clock in response to the command decoder detecting the data clock suspend command; the command decoder is further configured to detect a read or write command subsequent to detecting the data clock suspend command without performing synchronization of the data clock between detecting the data clock suspend command and detecting the read or write command, and the clock tree buffer is further configured to start toggling based on the data clock in response to the command decoder detecting the read or write command.

2. The apparatus of claim 1, wherein the memory is configured to perform a read or write operation in response to the read or write command.

3. The apparatus of claim 1, wherein the memory further comprises a memory mode register configured to store information of the data clock suspend command.

4. The apparatus of claim 3, wherein the information of the data clock suspend command indicates whether the memory supports the data clock suspend command.

5. The apparatus of claim 2, wherein the memory is configured to operate according to a low power double data rate dynamic random-access memory specification.

6. The apparatus of claim 5, wherein the data clock suspend command comprises operands of WS_WR and WS_FS at logic one and WS_RD at logic zero.

7. The apparatus of claim 5, further comprising one of a computing system, a mobile computing system, an Internet of Things device, a virtual reality system, or an augmented reality system incorporating the host, the memory, and the link, wherein the host further comprises at least on processor coupled to the memory to perform a computing function of the one of the computing system, the mobile computing system, the Internet of Things device, the virtual reality system, or the augmented reality system.

8. The apparatus of claim 7, wherein the memory comprises an LPDDR5 memory.

9. The apparatus of claim 7, the clock tree buffer is configured to receive an output directly or indirectly from a data clock buffer configured to receive the data clock.

10. An apparatus, comprising:
a host coupled to a memory via a link, wherein the host is configured to synchronize a data clock with the memory and to output write data or capture read data based on the data clock,
wherein the host comprises a memory controller configured
to provide a data clock suspend command to the memory via the link while the data clock is synchronized between the host and the memory, wherein the data clock suspend command notifies the memory to disable toggling a clock tree buffer, the clock tree buffer being configured to toggle based on the data clock,
to toggle the data clock after providing the data clock suspend command,
to provide a read or write command to the memory via the link, subsequent to providing the data clock suspend command, wherein the read or write command notifies the memory to start toggling a data clock buffer and
to provide the read or write command to access the memory, without performing synchronization of the data clock between providing the data clock suspend command and providing the read or write command.

11. The apparatus of claim 10, wherein the memory controller is configured to provide a mode register read command to the memory via the link, for information of the data clock suspend command, and configured to provide the data clock suspend command based on the information of the data clock suspend command.

12. The apparatus of claim 11, wherein the information of the data clock suspend command indicates whether the memory supports the data clock suspend command.

13. The apparatus of claim 11, wherein the memory controller is configured to operate in accordance with a low power double data rate dynamic random-access memory specification.

14. The apparatus of claim 13, wherein the data clock suspend command comprises operands of WS_WR and WS_FS at logic one and WS_RD at logic zero.

15. The apparatus of claim 13, further comprising one of a computing system, a mobile computing system, an Internet of Things device, a virtual reality system, or an augmented reality system incorporating the host, the memory, and the link, wherein the host further comprises at least on processor coupled to the memory to perform a computing function of the one of the computing system, the mobile computing system, the Internet of Things device, the virtual reality system, or the augmented reality system.

16. The apparatus of claim 15, wherein the memory comprises an LPDDR5 memory.

17. The apparatus of claim 15, wherein the read or write command is between a first time period and a second time period after the data clock suspend command.

18. A method to reduce power of a data clock for a memory coupled to a host via a link, comprising:
receiving a data clock, by the memory, from a host via a link;
synchronizing, by the memory, the data clock with the host;
toggling, by a clock tree buffer of the memory, based on the data clock to capture write data or to output read data;
detecting, by the memory, a data clock suspend command while the data clock is synchronized between the memory and the host;
disabling toggling the clock tree buffer based on the data clock, in response to detecting the data dock suspend command;
detecting, by the memory, a read or write command subsequent to detecting the data dock suspend command;
starting toggling based on the data dock, by the dock tree buffer, in response to detecting the read or write command and
performing a read or write operation, by the memory, in response to the read or write command, without performing synchronization of the data clock between detecting the data clock suspend command and detecting the read or write command.

19. The method of claim 18, further comprising storing, by a memory mode register, information of the data clock suspend command.

20. The method of claim 19, wherein the information of the data clock suspend command indicates whether the memory supports the data clock suspend command.

21. The method of claim 18, wherein the memory operates according to a low power double data rate dynamic random-access memory specification.

22. The method of claim 21, wherein the data clock suspend command comprises operands of WS_WR and WS_FS at logic one and WS_RD at logic zero.

23. The method of claim 22, wherein the link operates according to an LPDDR5 specification.

24. The method of claim 23, wherein the memory comprises an LPDDR5 memory.

25. The method of claim 24, wherein the host operates according to the LPDDR5 specification.

26. A method to reduce power of a data clock for a memory coupled to a host via a link, comprising
synchronizing a data clock between the host and the memory via a link;
toggling, by a clock tree buffer of the memory, based on the data clock to capture write data or to output read data;
providing, by the host to the memory via the link, a data clock suspend command, while the data clock is synchronized between the host and the memory;
disabling toggling based on the data clock, by the clock tree buffer, in response to the data clock suspend command;
toggling, by the host, the data clock after providing the data clock suspend command; and
providing, by the host to the memory via the link, a read or write command after the data clock suspend command, without performing synchronization of the data clock between providing the data clock suspend command and providing the read or write command.

27. The method of claim 26, further comprising starting toggling, by the memory, the clock tree buffer in response to the read or write command.

28. The method of claim 27, performing, by the memory, the read or write operation in response to the read or write command.

29. The method of claim 26, further comprising
providing, by the host to the memory via the link, a mode register read command; and
providing, by the memory to the host via the link, information of the data clock suspend command in response to the mode register read command.

30. The method of claim 29, wherein the information of the data clock suspend command indicates whether the memory supports the data clock suspend command.

31. The method of claim 30, providing the data clock suspend command in response to the information of the data clock suspend command.

32. The method of claim 31, wherein host, the memory, and the link operate in accordance with a low power double data rate dynamic random-access memory specification.

33. The method of claim 32, wherein the data clock suspend command comprises operands of WS_WR and WS_FS at logic one and WS_RD at logic zero.

34. The method of claim 33, wherein the host operates according to an LPDDR5 specification.

35. A method to reduce power of a data clock for a memory coupled to a host via a link, comprising:
providing, by a host to a memory via a link, a data clock synchronization command;
providing, by the host to the memory via the link, a data clock suspend command, after synchronizing a data clock, wherein the data clock suspend command notifies the memory to disable a data clock buffer which toggles based on the data clock;
toggling, by the host, the data clock after providing the data clock suspend command; and
providing, by the host to the memory via the link, a read or write command after the data clock suspend command, without performing synchronization of the data clock between providing the data clock suspend command and providing the read or write command.

36. The method of claim 35, further wherein the memory starts toggling the data clock buffer in response to the read or write command.

37. The method of claim 36, wherein the memory performs a read or write operation in response to the read or write command.

38. The method of claim 35, further comprising
providing, by the host to the memory via the link, a mode register read command for information of the data clock suspend command.

39. The method of claim 38, wherein the information of the data clock suspend command indicates whether the memory supports the data clock suspend command.

40. The method of claim 39, providing the data clock suspend command being in response to the information of the data clock suspend command.

41. The method of claim 35, wherein host, the memory, and the link operate in accordance with a low power double data rate dynamic random-access memory specification.

42. The method of claim 35, wherein the data clock suspend command comprises operands of WS_WR and WS_FS at logic one and WS_RD at logic zero.

* * * * *